United States Patent
Li et al.

(10) Patent No.: US 11,271,107 B2
(45) Date of Patent: Mar. 8, 2022

(54) REDUCTION OF BOTTOM EPITAXY PARASITICS FOR VERTICAL TRANSPORT FIELD EFFECT TRANSISTORS

(71) Applicant: International Business Machines Corporation, Armonk, NY (US)

(72) Inventors: Tao Li, Beijing (CN); Tsung-Sheng Kang, Ballston Lake, NY (US); Ruilong Xie, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 16/828,409

(22) Filed: Mar. 24, 2020

(65) Prior Publication Data

US 2021/0305424 A1 Sep. 30, 2021

(51) Int. Cl.
*H01L 29/78* (2006.01)
*H01L 29/66* (2006.01)
*H01L 27/088* (2006.01)
*H01L 29/10* (2006.01)
*H01L 21/762* (2006.01)

(52) U.S. Cl.
CPC .... *H01L 29/7827* (2013.01); *H01L 21/76224* (2013.01); *H01L 27/088* (2013.01); *H01L 29/1037* (2013.01); *H01L 29/66666* (2013.01)

(58) Field of Classification Search
CPC ........... H01L 29/7827; H01L 21/76224; H01L 27/1037
See application file for complete search history.

(56) References Cited

U.S. PATENT DOCUMENTS

| 5,943,575 A * | 8/1999 | Chung ................ H01L 21/8234 438/300 |
| 6,323,092 B1 * | 11/2001 | Lee .................... H01L 21/76229 257/E21.548 |
| 6,927,452 B2 | 8/2005 | Shin et al. |
| 7,701,033 B2 | 4/2010 | Williams et al. |
| 9,478,380 B2 | 10/2016 | Rojko |
| 9,716,170 B1 | 7/2017 | Cheng et al. |
| 9,773,901 B1 | 9/2017 | Gluschenkov et al. |
| 9,780,194 B1 | 10/2017 | Balakrishnan et al. |

(Continued)

OTHER PUBLICATIONS

A. Veloso et al., "Challenges and Opportunities of Vertical FET Devices using 3D Circuit Design Layouts" 2016.

*Primary Examiner* — Errol V Fernandes
(74) *Attorney, Agent, or Firm* — Fleit Intellectual Property Law; Thomas S. Grzesik

(57) ABSTRACT

A semiconductor device structure comprises at least one semiconductor fin for a vertical transport field effect transistor, a bottom source/drain layer, and an insulating layer underlying the bottom source/drain layer. A method of forming the structure comprises forming a sacrificial layer within a lower portion of a source/drain region for a vertical transport field effect transistor structure. The sacrificial layer being formed adjacent to at least one semiconductor fin and in contact with a substrate. A source/drain layer is formed within an upper portion of the source/drain region above the sacrificial layer. The sacrificial layer is removed thereby forming a cavity between the substrate and the source/drain layer. An insulating layer is formed within the cavity.

13 Claims, 7 Drawing Sheets

(56) References Cited

U.S. PATENT DOCUMENTS

| | | |
|---|---|---|
| 9,853,028 B1 | 12/2017 | Cheng et al. |
| 10,090,412 B1 | 10/2018 | Cheng et al. |
| 10,211,315 B2 | 2/2019 | Zang et al. |
| 2018/0226489 A1* | 8/2018 | Bi ................... H01L 29/66666 |
| 2019/0386135 A1* | 12/2019 | Li ...................... H01L 29/456 |

* cited by examiner

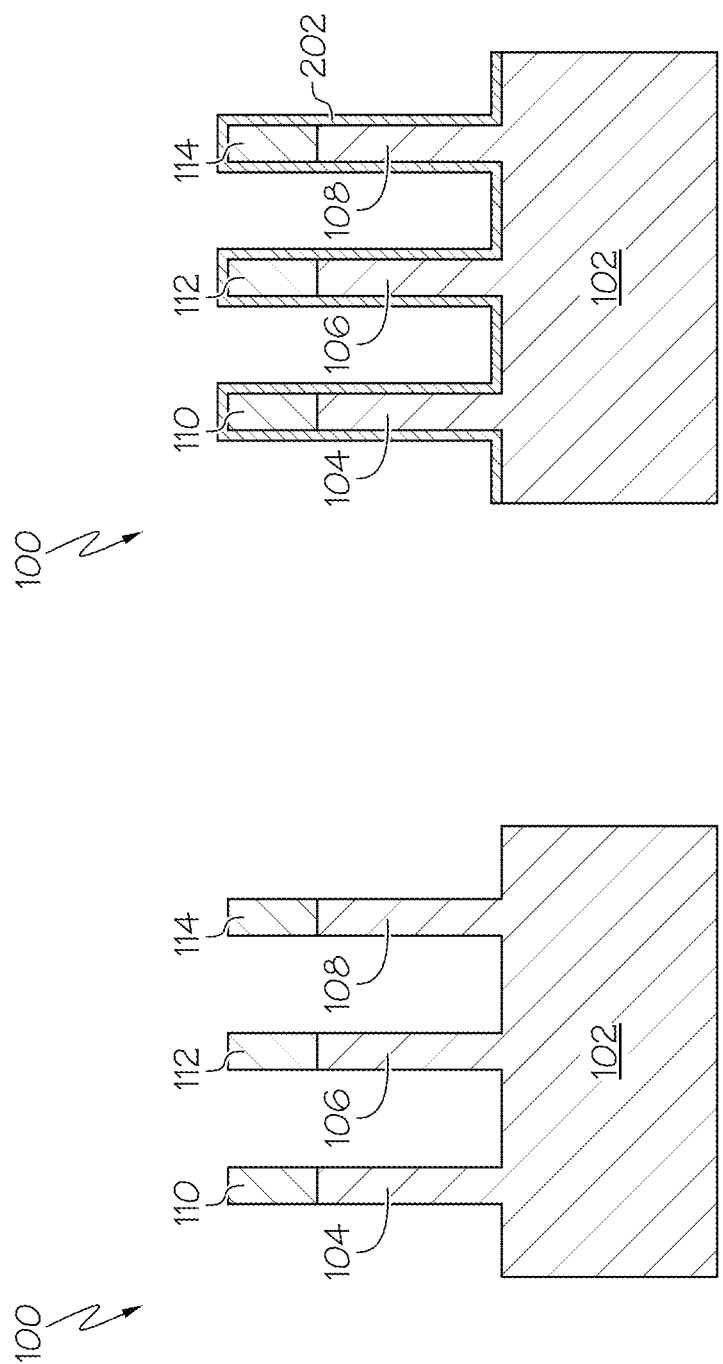

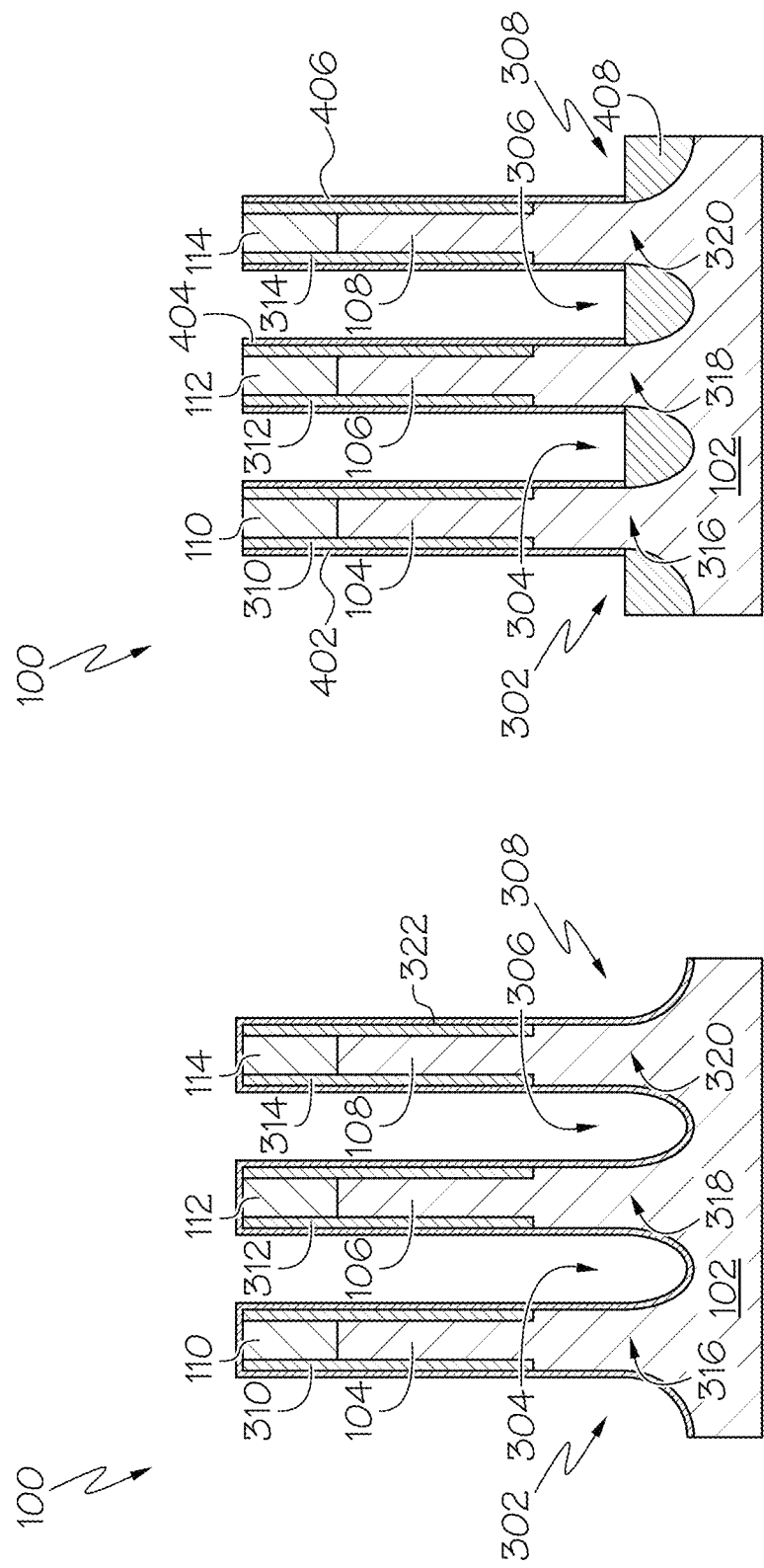

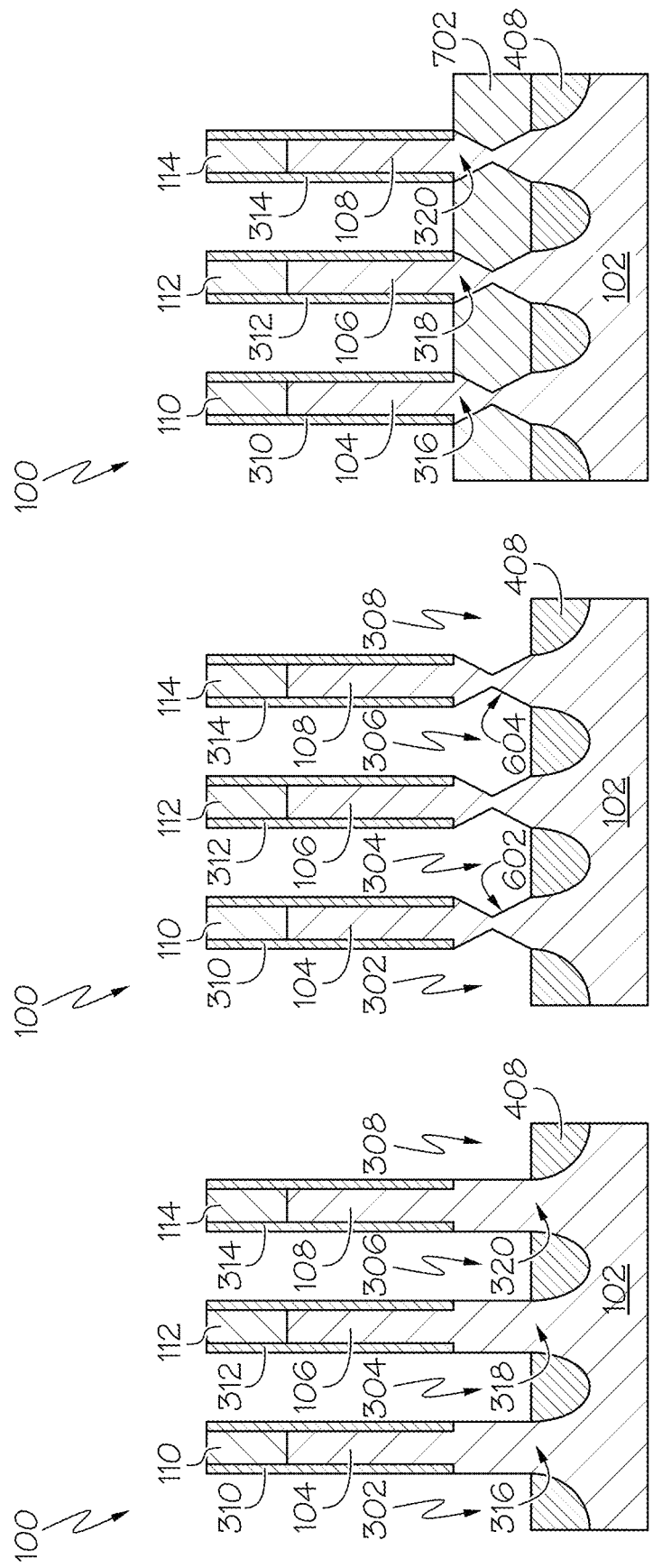

US 11,271,107 B2

REDUCTION OF BOTTOM EPITAXY PARASITICS FOR VERTICAL TRANSPORT FIELD EFFECT TRANSISTORS

BACKGROUND OF THE INVENTION

The present invention generally relates to the field of semiconductors, and more particularly relates to vertical field effect transistors.

Vertical transport field effect transistors (VTFETs or VFETs) are becoming viable device options for semiconductor devices, for example, complementary metal oxide semiconductor (CMOS) devices, beyond 5 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method of forming a semiconductor device structure comprises forming a sacrificial layer within a lower portion of a source/drain region disposed within a substrate of a vertical transport field effect transistor structure. The sacrificial layer is formed adjacent to at least one semiconductor fin and in contact with the substrate. A source/drain layer is formed within an upper portion of the source/drain region above the sacrificial layer. The sacrificial layer is removed thereby forming a cavity between the substrate and the source/drain layer. An insulating layer is formed within the cavity.

In another embodiment, a semiconductor device structure comprises at least one semiconductor fin for a vertical transport field effect transistor, a bottom source/drain layer, and an insulating layer underlying the bottom source/drain layer.

In a further embodiment, an integrated circuit comprises at least one vertical transport field effect transistor. The least one vertical transport field effect transistor comprises at least one semiconductor fin for a vertical transport field effect transistor, a bottom source/drain layer, and an insulating layer underlying the bottom source/drain layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 1 is a cross-sectional view of a semiconductor device structure after a plurality of fins have been formed on a substrate according to one embodiment of the present invention;

FIG. 2 is a cross-sectional view of the semiconductor device structure after liner material has been deposited according to one embodiment of the present invention;

FIG. 3 is a cross-sectional view of the semiconductor device structure after the substrate has been recessed to form source/drain regions and after an additional liner material has been deposited according to one embodiment of the present invention;

FIG. 4 is a cross-sectional view of the semiconductor device structure after a bottom sacrificial layer has been formed in the source/drain regions according to one embodiment of the present invention;

FIG. 5 is a cross-sectional view of the semiconductor device structure after the additional liner material has been removed to exposed bottom portions of the fins according to one embodiment of the present invention;

FIG. 6 is a cross-sectional view of the semiconductor device structure after the bottom portions of the fins within the source/drain regions have been etched according to one embodiment of the present invention;

FIG. 7 is a cross-sectional view of the semiconductor device structure after a bottom source/drain layer has been formed according to one embodiment of the present invention;

DETAILED DESCRIPTION

Figure 8:
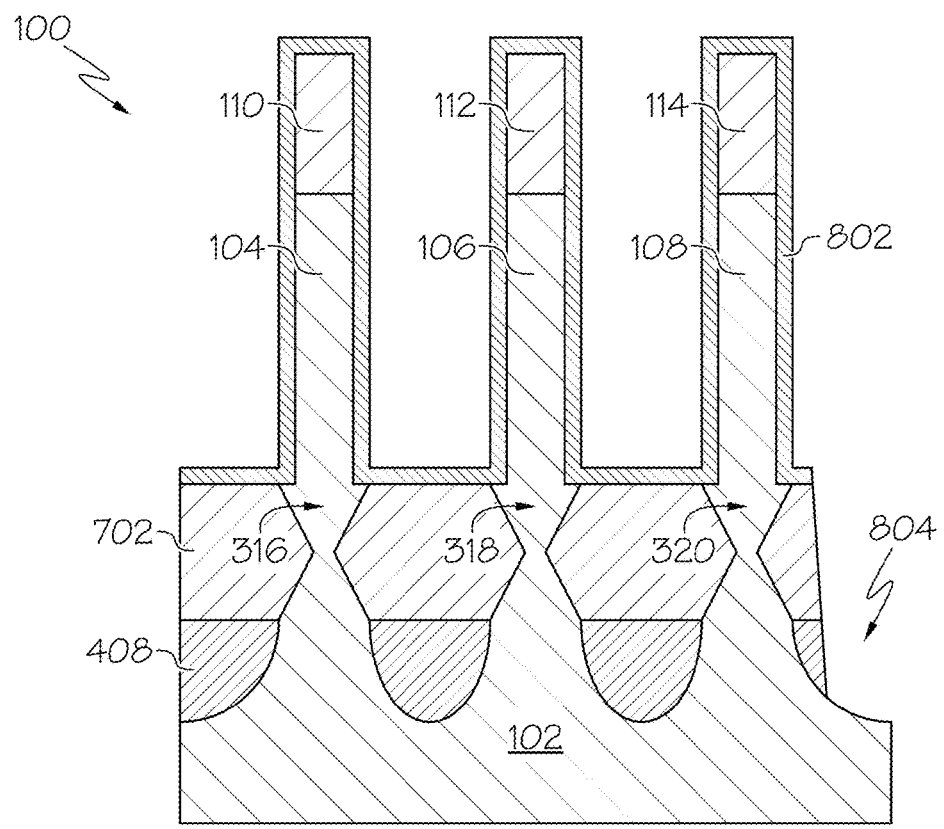
FIG. 8 is a cross-sectional view of the semiconductor device structure after the fin sidewall liner has been removed and an additional liner has been formed, and further after device isolation regions have been formed according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Vertical channel semiconductor devices such as vertical transport FETs (VTFETs) are being pursued as a viable CMOS architecture beyond the 7 nm node. A VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

As the pitch between VTFET fins decreases (e.g., less than 40 nm) it becomes very difficult for current fabrication processes to form deep isolation regions between devices. When the device isolation layer is not deep enough between tightly pitched device fins there is a high likelihood of parasitic leakage paths occurring between devices. For example, when a shallow trench isolation (STI) layer is not more than 50 nm deeper than the bottom surface of the bottom source/drain epi parasitic leakage paths can occur. There is also a high likelihood of failure mechanisms such as latch-up occurring. As will be discussed in greater detail below, embodiments of the present invention overcome these problems by forming a bottom isolation layer under bottom epitaxy regions of VTFET devices. The bottom isolation layer suppresses parasitic leakage paths and parasitic capacitance, and further prevents failures such as latch-up.

FIGS. 1 to 11 illustrate one or more processes for reducing bottom epitaxy parasitics in VTFETs according to one or more embodiments of the present invention. In general, the figures comprise various cross-sectional views of a structure. More specifically, FIGS. 1-7 and 11 are cross-sectional views are taken along a line that passes through the short axis of a plurality of fins. FIGS. 8A, 9A, and 10A are cross-sectional views taken along a line that passes through the long axis of a fin. FIGS. 8B, 9B, and 10B are cross-sectional views taken along a line that passes through a source/drain area adjacent to one or more fins.

Figure 11:
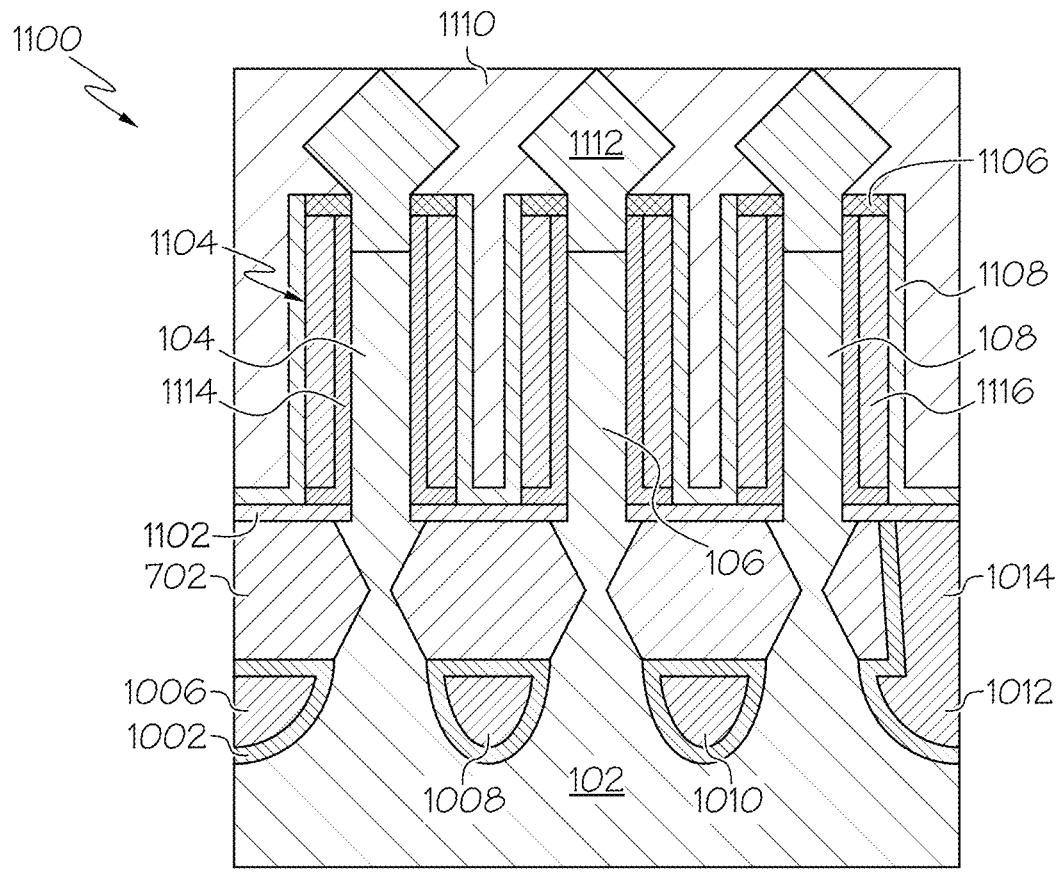
FIG. 11 is a cross-sectional view of the semiconductor device structure after additional fabrication process have been formed to complete the device structure according to one embodiment of the present invention.

FIGS. 1A and 11 show a semiconductor device structure 100 at a given point in the fabrication process. For example, FIG. 1 shows a substrate 102; a plurality of fin structures 104 to 108; and a hard mask 110 to 114 formed on and in contact with a top surface of each fin structure 104 to 108. In some embodiments, the substrate 102 is a bulk substrate. The structure 100 may comprise fins (channels) 104 to 108 for PFET devices, NFET devices, or a combination of both. In one embodiment, the substrate 102 comprises entirely of a semiconductor material. The substrate 102 may comprise a single crystalline semiconductor material a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 102 may comprise undoped single crystalline silicon or single crystalline silicon doped with p-type dopant atoms or n-type dopant atoms. Examples of materials for the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in whish fins for multi-gate devices can be form ed. In other embodiments, the substrate 102 may be formed on and in contact with a handle substrate or an insulating layer disposed in contact with a handle substrate. In this embodiment, the handle substrate includes similar materials to those discussed above.

Doping of the substrate 102 (or other semiconductor layer from which the fins structures 104 to 108 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device, at concentrations in the general range of, for example, e20/cm$^3$.

In other embodiments, the substrate 102 may be a silicon-on-insulator (SOI) substrate. In this example, an optional dielectric layer (e.g., a BOX layer or oxide layer) overlies the substrate, and the fins 104 to 108 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fins 104 to 108 are fabricated may be formed utilizing various methods such as a layer transfer process including a bonding step, or an implantation process such as SIMOX (Separation by IMplantation of OXygen). This semiconductor material/layer may be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from $1\times10E18$ atoms/cm3 to $2\times10E21$ atoms/cm3. N-type transistors are produced by doping the semiconductor material/layer with elements from group V of the periodic table (e.g., phosphorus, antimony, or arsenic).

The semiconductor fins 104 to 108 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fin structures 104 to 108 may be subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). After the RIE etching process, the photo-resist mask used in the lithographic etching process may be removed, leaving the fin structures 104 to 108 and hard masks 110 to 114.

FIG. 2 shows that, in one embodiment, a conformal layer of a first liner material 202 is formed over the structure 100 in contact with a top surface of the substrate 102; sidewalls of the fin structure 104 to 108; sidewalls of the hard masks 110 to 114; and a top surface of the hard masks 110 to 114. The first liner material 202 may be deposited by, for example, ALD or another deposition process and may comprise one or more layers/materials such as silicon oxide, silicon nitride, silicon boron nitride, siliconborocarbonitride or some other dielectric.

FIG. 3 shows that the substrate 102, in one embodiment, is then recessed to form a bottom source/drain recess areas 302 to 308. The substrate 102 may be recessed using, for example, directional RIE. In some embodiments, a lateral etch may also be performed to trim the fin bottom. The recessing process removes portions of the first liner material 202 situated on top of the hard masks 110 to 114 and between the fin structures 104 to 108, and etches down underlying portions of the substrate 102 to form the bottom source/drain recess areas 302 to 308. The remaining portions of the first liner material 202 form fin sidewall liners 310 to 314 in contact with sidewalls of the fin structures 104 to 108 and sidewalls of the hard masks 110 to 114. The above process further forms exposed bottom portions 316 to 320 underlying the fin sidewall liners 310 to 314 and the fin channels formed by the initial fin structures 104 to 108.

After the bottom source/drain recess area 302 to 308 have been formed, a second liner material 322 is deposited over the structure 100. In one embodiment, a deposition process such as ALD is performed to conformally deposit the second liner material 314 in contact with the bottom source/drain recess area 302 to 308; the first set of liners 310 to 314; and sidewalls of the exposed fin bottom portions 316 to 320. The second liner material 322 may comprise silicon oxycarbonitride (SiOCN), silicon boron carbonitride (SiBCN), and/or the like. In some embodiments, the first liner material 202 and the second liner material 322 comprise different materials.

FIG. 4 shows the second liner material 322 is then etched to remove a portion of the material 322 from the top surface of the fin sidewall liners 310 to 314 and from a lower portion the bottom source/drain recess areas 302 to 308. The second liner material 322 may be etched using a directional etching process such as RIE. The etching process results additional fin liners 402 to 406 each being formed on the sidewalls of one of the fin sidewall liners 310 to 314 and sidewalls of one of the lower fin portions 316 to 320 below the channel region of the fin structures 104 to 108. This process also results in portions of the substrate 102 a being exposed.

FIG. 4 further shows that after the second liner material 322 has been etched, a bottom sacrificial layer 408 is formed within the lower portion of the bottom source/drain recess areas 302 to 308 in contact with the exposed portions of the substrate 102. The sacrificial layer 408, in some embodiments, also contacts a bottom-most surface of the additional fin liners 402 to 406. The bottom sacrificial layer 408, in one embodiment, comprises germanium or any other material that may be etched selective to a subsequently formed bottom source/drain layer.

In some embodiments, the bottom sacrificial layer 408 is be formed by epitaxial growth of a semiconductor material. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

FIG. 5 shows that after the bottom sacrificial layer 408 is formed, the additional fin liners 402 to 406 are removed thereby exposing the fin sidewall liners 310 to 314 and the bottom fin portions 316 to 320 underlying the channel regions of the fin structures 104 to 108. The additional fin liners 402 to 406 may be removed using, for example, an isotropic etch. For example, if the liners 402 to 406 comprise silicon nitride a selective wet etch such as a hot phosphorus wet etch can be used to remove the liners 402 to 406.

FIG. 6 shows that the exposed bottom portions 316 to 320 of the fin structures 104 to 108 within the source/drain recess areas 302 to 308 are selectively etched. In one embodiment, the etching process is a wet etch, dry etch, or a combination of wet and dry etching processes that may be isotropic such that the bottom source/drain recess areas 302 to 308 are enlarged. For example, a chemical vapor etching (CVE) with an $HCl/H_2$ gas mixture may be utilized to perform the etch. In some embodiments the etching process etches into the exposed bottom portions 316 to 320 of the fin structures 104 to 108 such that etched surfaces 602, 604 have angled or tapering sidewalls that angle or taper toward each other in the direction toward the middle of the fin (e.g., a sigma shape). However, embodiments of the present invention are not limited to such a configuration and other shapes may be suitable as well.

After the bottom fin portions 316 to 320 have been etched, a bottom source/drain layer 702 is formed within the source/drain regions 302 to 308 as shown in FIG. 7. The bottom source/drain layer 702 may either be a source layer or a drain layer and formed in contact with at least the bottom portions 316 to 320 of the fin structures 104 to 108, and further formed on top of and in contact with a top surface of the bottom sacrificial layer 408. A single bottom source/drain layer 702 (merged) may be formed for multiple fin structures 104 to 108 or a separate bottom source/drain layer 702 may be formed for each fin structure 104 to 108. In one embodiment, a portion of the bottom source/drain layer 702 extends laterally beyond the fin sidewall liner 310 to 314 toward the center of its a respective fin structure 104 to 108. In one embodiment, the bottom source/drain layer 702 is formed by epitaxial growth of a semiconductor material. Example materials for the bottom source/drain layer 702 include (but are not limited to) phosphorus doped silicon epitaxy for an nFET device and boron doped silicon germanium epitaxy for a pFET device.

In one embodiment, the bottom source/drain layer 702 may have a thickness of about 10 nm to about 60 nm. However, other thicknesses are applicable as well. The bottom source/drain layer 702 may be doped with dopant atoms. The dopant atoms may be an n-type dopant (i.e., an element from Group V of the Periodic Table of Elements) or a p-type dopant (i.e., an element from Group III of the Periodic Table of Elements). Examples of n-type dopants for a group IV semiconductor include phosphorus, arsenic and antimony. Examples of p-type dopants for a group IV semiconductor include boron, aluminum, and gallium. Examples of n-type dopants for a III-V semiconductor include selenium, tellurium, silicon, and germanium. Examples of p-type dopants for a III-V semiconductor include beryllium, zinc, cadmium, silicon, and germanium.

After the bottom source/drain layer 702 has been formed, an anneal may be performed to drive the dopant in the bottom source/drain into the fin structures 104 to 108. A thermal anneal process such as laser anneal, flash anneal, rapid thermal anneal (RTA), furnace anneal, or any suitable combination of those annealing techniques may be performed. This process forms a first doped fin region in a portion of the fin structures 104 to 108 laterally contacted by the bottom source/drain layer 702. It should be noted that the anneal may be performed at a subsequent point in the fabrication process. The dopant concentration of the bottom source/drain layer 702 may be from $1 \times 10^{20}$ atoms/cm3 to $1 \times 9^{22}$ atoms/cm3, although lesser and greater dopant concentrations may also be employed.

Figure 8A:
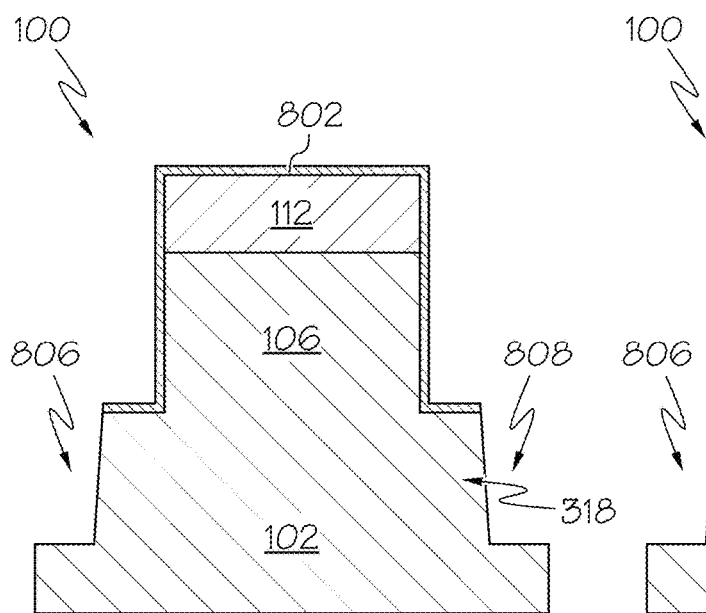
FIG. 8A is a cross-sectional view of the structure shown in FIG. 8 taken along a line passing through the long access of a fin according to one embodiment of the present invention.
Figure 8B:
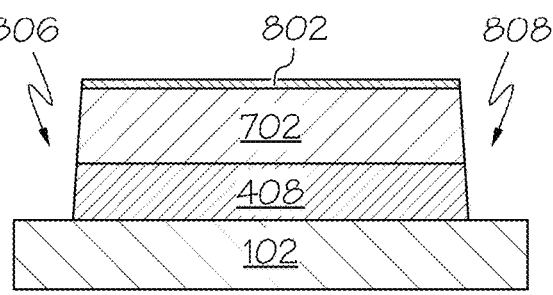
FIG. 8B is a cross-sectional view of the structure shown in FIG. 8 taken along a line passing through a source/drain region of the structure according to one embodiment of the present invention.

FIGS. 8 to 8B show that after the bottom source/drain layer 702 has been formed, the fin sidewall liners 310 to 314 are removed using, for example, an isotropic etch. A new fin liner 802, in one embodiment, is then formed to protect the fin structures 104 to 108 and bottom source/drain layer 702 from subsequent processing steps. In one embodiment, the fin liner 802 is formed by depositing a liner material over the structure 100 using, for example, a conformal deposition process such as ALD. The liner material may comprise one or more layers/materials such as silicon oxide, silicon nitride, silicon boron nitride, siliconborocarbonitride or some other dielectric. The fin liner 802, in one embodiment, is formed on and in contact with a top surface of the bottom source/drain layer 702; sidewalls of the fin structures 104 to 108; and a top surface of the hard masks 110 to 114. In some embodiments, the fin liner 802 is also formed on and in contact with a top-most surface of the bottom fin portions 316 to 320 underlying the channel region of the fin structures 104 to 108.

FIGS. 8 to 8B further show that one or more device isolation regions 804 to 808 such as shallow trench isolation (STI) regions are formed to insulate/isolate different devices from each other. The isolation regions 804 to 808 may be formed by depositing an organic planarization layer (OPL) and patterning the OPL. This patterning process forms isolation trenches by etching exposed portions of the additional liner material 802 and underlying portions of the bottom source/drain layer 702, bottom sacrificial layer 408, and substrate 102. The formation of the isolation regions 804 to 808 exposes sidewall portions of the bottom source/drain layer 702 and the bottom sacrificial layer 408.

Figure 9:
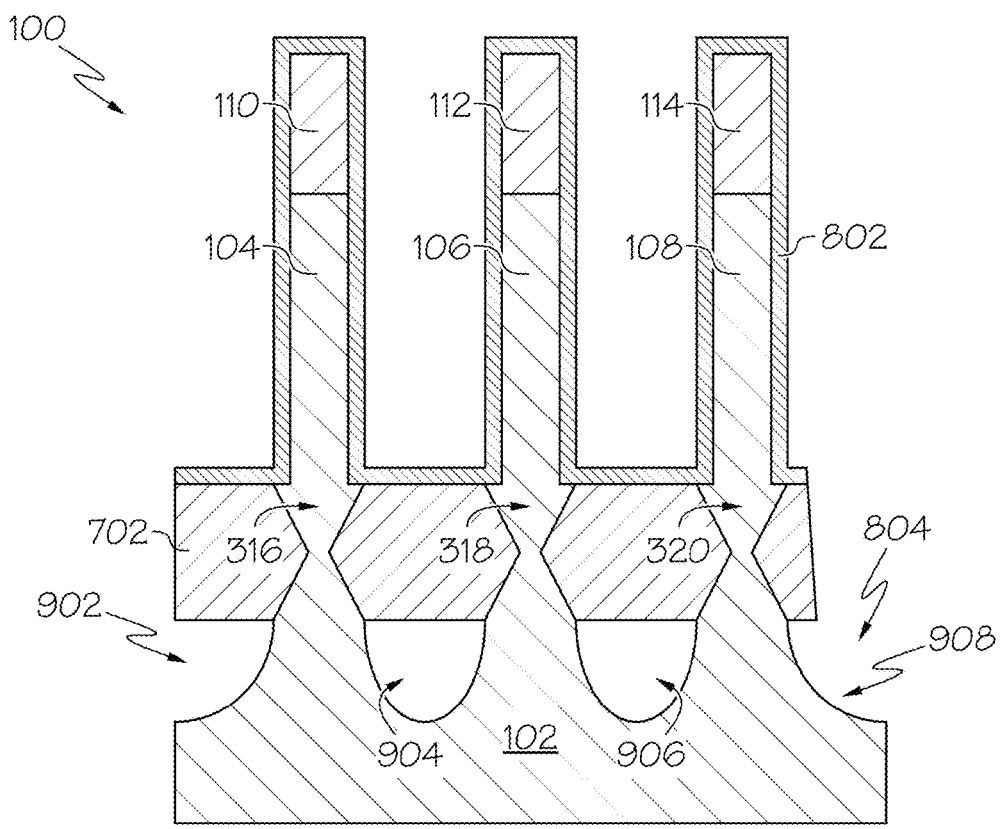
FIG. 9 is a cross-sectional view of the semiconductor device structure after the bottom sacrificial layer has been removed according to one embodiment of the present invention.
Figures 9A, 9B:
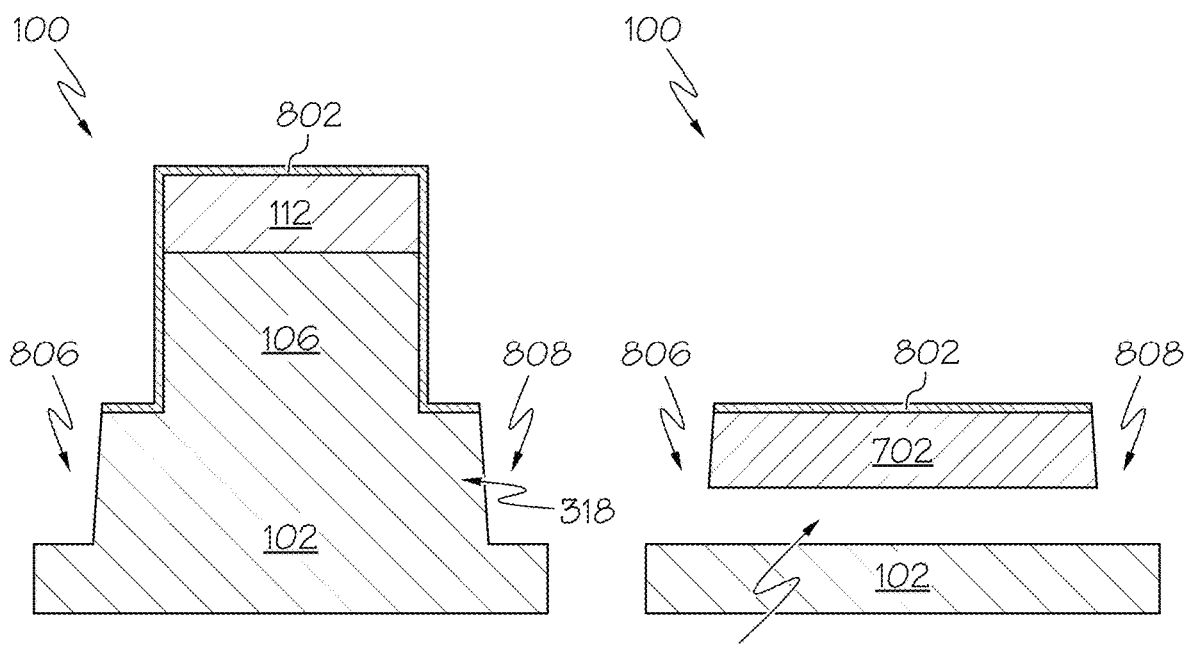
FIG. 9A is a cross-sectional view of the structure shown in FIG. 9 taken along a line passing through the long access of a fin according to one embodiment of the present invention.
FIG. 9B is a cross-sectional view of the structure shown in FIG. 9 taken along a line passing through a source/drain region of the structure according to one embodiment of the present invention.

FIGS. 9 to 9B show that the bottom sacrificial layer 408 is then removed selective to the bottom source/drain layer 702. For example, an isotropic etch (e.g., wet chemical etch, dry plasma etch, gas phase etch, etc.) can be utilized to selectively remove the bottom source/drain layer 702. This process forms a cavities 902 to 908 in the space previously occupied by the bottom sacrificial layer 408. For example, the cavities 902 to 908 are situated between a bottom surface of the bottom source/drain layer 708 and the substrate 102.

Figure 10:
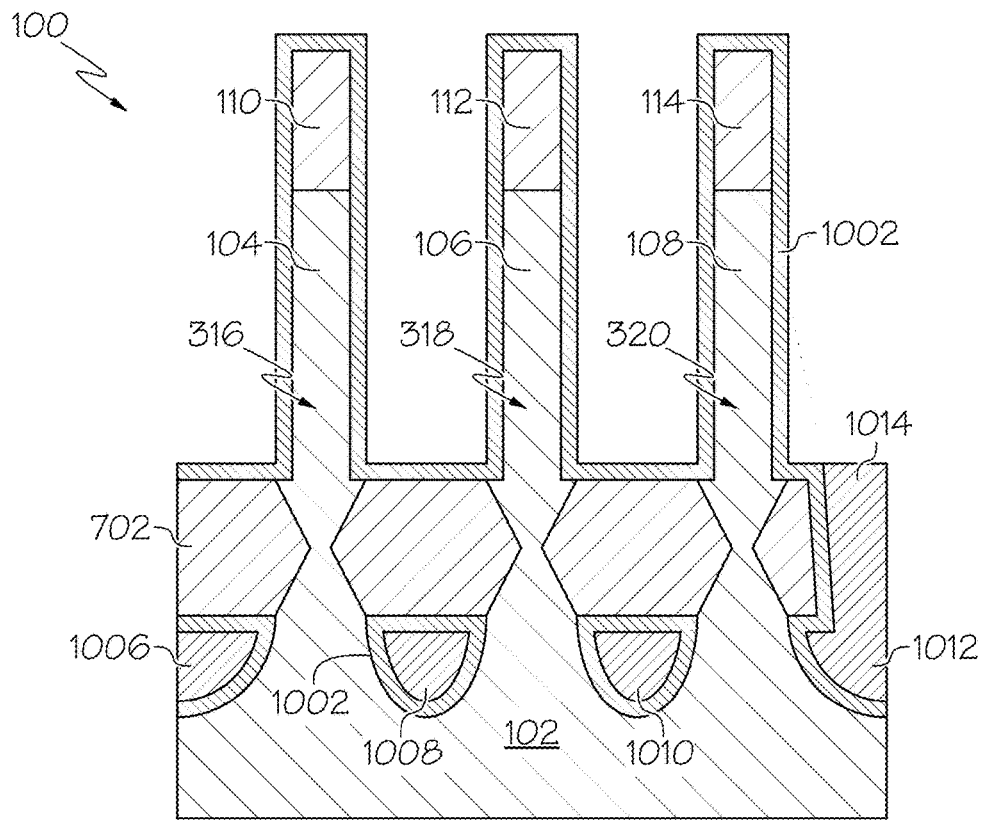
FIG. 10 is a cross-sectional view of the semiconductor device structure after the liner has been removed, new insulating/isolation layers have been formed, and shallow trench isolation fill and recess have been performed according to one embodiment of the present invention.
Figure 10A:
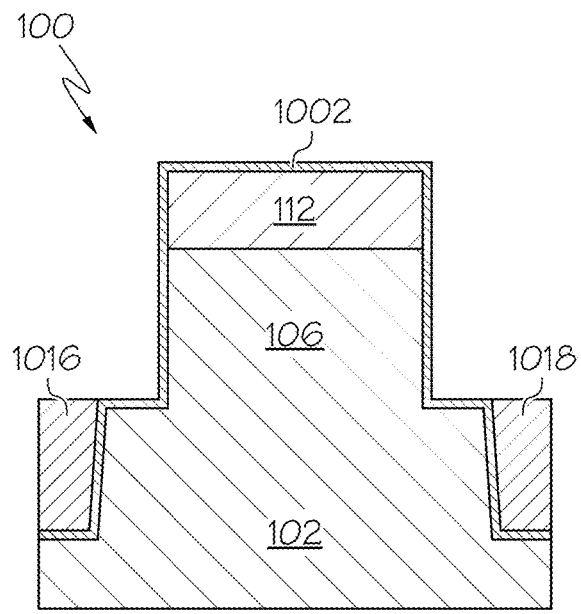
FIG. 10A is a cross-sectional view of the structure shown in FIG. 10 taken along a line passing through the long access of a fin according to one embodiment of the present invention.
Figure 10B:
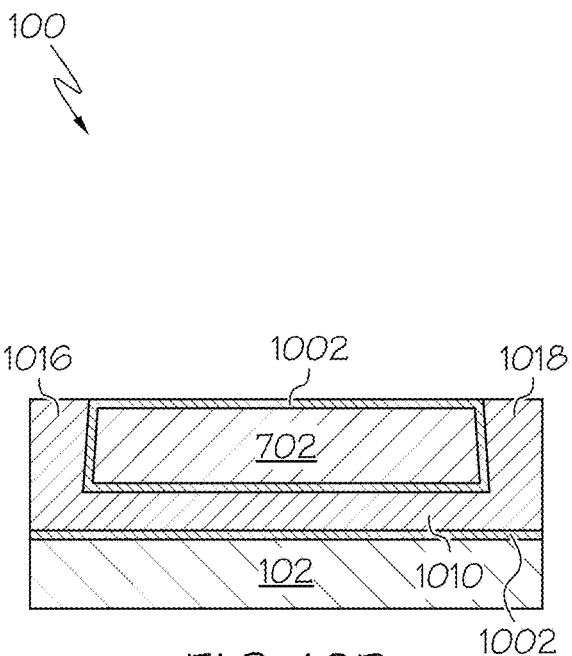
FIG. 10B is a cross-sectional view of the structure shown in FIG. 10 taken along a line passing through a source/drain region of the structure according to one embodiment of the present invention.

FIGS. 10 to 10B show that, in one embodiment, the fin liner 802 is removed using, for example, an isotropic etch and insulating/isolation layer liner 1002 is formed. The isolation layer liner 1002, in one embodiment, is formed by conformally depositing at least a liner material over the structure using a deposition process such as ALD. The liner material may comprise one or more layers/materials such as silicon oxide, silicon nitride, silicon boron nitride, silicon-borocarbonitride or some other dielectric. The deposition process results in the isolation layer liner 1002 being formed over the entire structure 100.

For example, the liner 1002 is formed one and in contact with the sidewalls of the fin structures 104 to 108; sidewalls of the hard marks 110 to 114; the top surface of the hard masks 110 to 114; the top-most surface (if exposed) of the bottom fin portions 316 to 320; the top surface, bottom surface, and sidewalls of the bottom source/drain layer 702; and exposed portions of the substrate 102 in the cavities 902 to 908 and isolation regions 804 to 808. The liner 1002 surrounds the bottom source/drain layer 702 and the walls of the cavities 902 to 908, which are formed by the bottom surface of the source/drain layer and exposed portions of the substrate 102. In one embodiment, the isolation liner 1002 is a stacked liner comprising multiple layers/materials. For example, an additional liner material (not shown) may be conformally formed on and in contact with the liner material using a process such as ALD. The additional liner material, in one embodiment, comprises silicon oxycarbonitride (SiOCN), silicon boron carbonitride (SiBCN), and/or the like.

FIGS. 10 to 10B further show that after the isolation liner 1002 has been formed, bottom insulating layers 1006 to 1012 are formed within the cavities 902 to 908 and isolation layers 1014 to 1018 are formed within the isolation regions 804 to 808. The insulating layers 1006 to 1010 contact and are encapsulated by the isolation liner 1002 formed within the cavities 902 to 908. The isolation layers 1014 to 1018 further contact the portions of the isolation liner 1002 formed in the isolation regions 804 to 808. FIG. 10B shows that the insulating layers 1006 to 1010 formed within the cavities 902 to 908 underlying the bottom source/drain layer 702 directly contact the isolation layers 1014 to 1018 are formed within the isolation regions 804 to 808 since the cavities 902 to 908 are open to the isolation regions 804 to 808. The combination of the bottom insulating layers 1006 to 1012 suppress any parasitic leakage paths and parasitic capacitance and further prevents device failures such as latch-up caused by the isolation regions 804 to 808 possibly being formed too shallow due to tight pitches between the fin structures 104 to 108.

In one embodiment, the insulating layers 1006 to 1012 and isolation layers 1014 to 1018 (e.g., shallow trench isolation layers) are formed by depositing an insulating/isolation material over the structure 100. The insulating/isolation material fills the cavities 902 to 906 and isolation regions 804 to 808. In one embodiment, the deposition process includes ALD, CVD, or another applicable process. The insulating material, in one embodiment, is a low-k material such as (but not limited to) silicon nitride (SiN), silicon boron carbonitride (SiBCN), silicon oxycarbonitride (SiOCN), silicon oxynitride (SiON), silicon carbide (SiC), SiO2 and/or the like. Excess insulating/isolation material may then be removed using, for example, CMP and followed by an isotropic etching processing resulting in the structure shown in FIGS. 10 to 10B.

FIG. 11 shows one example of a VTFET structure 1100 after additional fabrication processes have been performed. The structure 1100, in one embodiment, comprises a bottom spacer layer 1102, gate structures 1104, top spacer layer 1106, encapsulation layers 1108, dielectric layer 1110; and top source/drains 1112. It should be noted that embodiments of the present invention are not limited to the example of a VTFET structure shown in FIG. 11 as one or more additional features/layers may be added; one or more features/layers may be removed; and/or one or more features/layers may have a different shape and/or configuration than what is shown.

In one embodiment, the bottom spacer 1102 is formed on and in contact with the bottom source/drain layer 702, sidewalls of the fin structures 104 to 108, and any exposed top surface portions of the bottom fin portions 316 to 320 For example, one or more etching processes may be used to remove the isolation liner 1002 from the fins structures 104 to 108; hard masks 110 to 114; and top surface of the bottom source/drain layer 702 and any exposed top surface portions of the bottom fin portions 316. An insulating material (such as silicon oxide, silicon nitride, silicon oxynitride, or a combination of these) and is then formed using any non-conformal deposition process such as, for example, high density plasma (HDP) and physical vapor deposition (PVD) and subsequent etching techniques. The deposited spacer material may then be subsequently etched to form the final spacer structure.

The gate structures 1104, in one embodiment, each comprise a gate dielectric layer 1114 and a gate conductor layer 1116. The gate dielectric layer 1114 contacts contact the sidewalls of the fin structures 104 to 108 and the bottom spacer 1102. The gate dielectric layer 1114 may be formed by depositing a thin conformal layer over the structure by, for example, CVD, PECVD, or ALD. In one embodiment, the gate dielectric layer 1114 may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 1114 may further include dopants such as lanthanum or aluminum. After formation of the gate dielectric layer 1114, an annealing process may be performed to form bottom source/drain junctions within a portion of the fin structures 104 to 108.

The gate conductor layers 1116 may be formed in contact with and surrounding the vertical sidewalls of the gate dielectric layers 1114. In one embodiment, the gate conductor layers 1116 may be formed by depositing one or more conductive materials over the structure. Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack. An isotropic etch may be performed to recess the gate structures 1104.

The top spacer 1106 may be formed on and in contact with the top surface of the gate dielectric layers 1114 and the gate conductor layers 1116. The top surface of the spacer 1106 may be co-planar with the top surfaces of the fin structures 104 to 108. In one embodiment, the top spacer 1106 may comprise the same or different material as the bottom spacer layer 1102. For example, the top spacer 1106 may comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure.

The encapsulation layers 1108 such as (but not limited to) silicon nitride may then formed over the structure using a conformal deposition process. During the following top source/drain layer formation process, one or more etching processes may be performed to remove the encapsulation layer material from the top surface of the top spacer 2206 and the top junctions formed within the fin structures 104 to 108.

The dielectric layer 1110 may then be formed over the structure 1100 in contact with top spacer 1106 and encapsulation layers 1108. The dielectric layer 1110, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Planarization, for example, CMP can be performed to remove excess material.

The hard masks 110 to 114 may then be selectively removed by, for example, RIE which stops on the fin structures 104 to 108. Top source/drains 1112 may then be formed in contact with at least the top source/drain junctions. The top source/drains 1112 may be formed using an epitaxy process. For example, selective epitaxy may be used to grow material from the exposed top source/drain junctions to form the top source/drain layers 1112. The top source/drain layers 1112 may either be a source layer or a drain layer and may comprise in-situ doping (boron, in one embodiment for PFET and phosphorus, in one embodiment, for NFET). It should be noted that, according to one embodiment, the top source/drain layers 1112 may not contain any doping. Doping may be performed using any standard approach such as ion implantation. In particular, due to the slower growth rates on (111) orientated surface during the epitaxial growth so that faceted top source/drain layers 1112 are obtained. As shown in FIG. 11, the top source/drain layers 1112 comprise angled sides. In some embodiments, the top/source drain layers 1112 comprise a diamond shape. The epitaxial growth of diamond shaped epitaxy is self-limiting to the outer <111> plane resulting in diamond outer periphery. It should be noted that, non-faceted epitaxy and/or multiple epitaxy steps can be used to form the top source/drain layers 1112 without limiting the scope of the present disclosure. It should also be noted that, in some embodiments, the top/source drain layers 1112 may be merged.

In one or more embodiments, an annealing process may be conducted after the formation of the top source/drain layer 1112 in order to push the top junctions further into the fin structures 104 to 108. A thermal anneal process such as laser anneal, flash anneal, rapid thermal anneal (RTA), furnace anneal, or any suitable combination of those annealing techniques can be performed. In some embodiments, the junctions may have a height of, for example, 4 nm to 10 nm Although other dimensions are applicable as well. The bottom surface of the top junctions may be above, below, or stop at the gate dielectric layers 1114.

An additional dielectric (shown as part of dielectric 1110) may then be formed over the entire structure. The dielectric layer, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The dielectric layer may be patterned and etched to form one or more contact openings/trenches (not shown) to expose the top source/drain layers 1112. One or more contact metal/metallic layers (not shown) may then be formed within the contact opening(s). The contact metal/metallic layers may fill the contact opening(s) and contact the top surface of the source/drain layers 1112 (or any liner and/or the silicide formed thereon). The contact metal layer(s), in one embodiment, may comprise tungsten (W), titanium (Ti), tantalum (Ta), TiN, hafnium (Hf), zirconium (Zr), niobium (Nb), or alloys comprising carbon. However, other materials are applicable as well.

Figure 12:
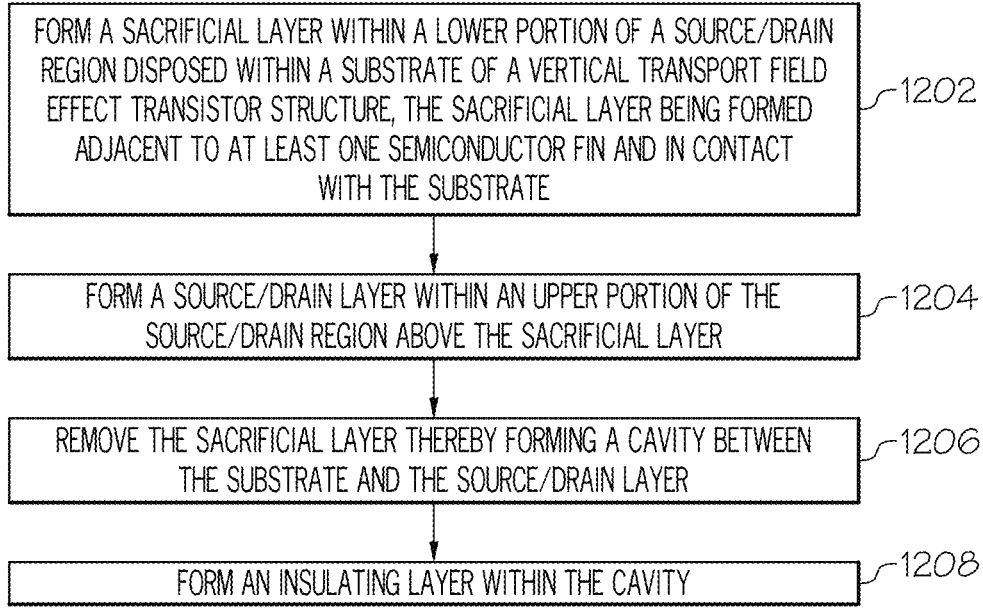
FIG. 12 is an operational flow diagram illustrating one example of a process for reducing bottom epitaxy parasitics for vertical transport field effect transistors according to a further embodiment of the present invention.

FIG. 12 is an operational flow diagram illustrating one example of a process for reducing bottom epitaxy parasitics for VTFETs according to one embodiment of the present invention. It should be noted that each of the steps shown in FIG. 12 have been discussed in greater detail above with respect to FIGS. 1 to 11. A sacrificial layer, at step 1202, is formed within a lower portion of a source/drain region disposed within a substrate of a vertical transport field effect transistor structure. The sacrificial layer is formed adjacent to at least one semiconductor fin and in contact with the substrate. A source/drain layer, at step 1204, is formed within an upper portion of the source/drain region above the sacrificial layer. The sacrificial layer, at step 1206, is removed thereby forming a cavity between the substrate and the source/drain layer. An insulating layer, at step 1208, is formed within the cavity.

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor device structure comprising:
   at least one semiconductor fin for a vertical transport field effect transistor;
   a bottom source/drain layer; and
   an insulating layer underlying and in contact with a portion of the bottom source/drain layer formed in at least non-shallow trench isolation areas.

2. The semiconductor device structure of claim 1, further comprising:
   a device isolation region comprising an isolation layer in contact with the insulating layer.

3. The semiconductor device structure of claim 1, wherein the insulating layer is disposed between the bottom source/drain layer and a substrate.

4. The semiconductor device structure of claim 1, further comprising:
   at least one liner surrounding the insulating layer.

5. The semiconductor device structure of claim 4, wherein the at least one liner is in contact with a bottom surface of the bottom source/drain layer.

6. The semiconductor device structure of claim 1, wherein the bottom source/drain layer is in contact with and surrounds a lower portion of the at least one semiconductor fin.

7. The semiconductor device structure of claim 6, wherein the lower portion of the at least one semiconductor fin comprises angled or tapered sidewalls.

8. An integrated circuit comprising:
   at least one vertical transport field effect transistor, wherein the at least one vertical transport field effect transistor comprises:
   at least one semiconductor fin;
   a bottom source/drain layer; and
   an insulating layer underlying and in contact with a portion of the bottom source/drain layer formed in at least non-shallow trench isolation areas.

9. The integrated circuit of claim 8, wherein the at least one vertical transport field effect transistor further comprises:
   a device isolation region comprising an isolation layer in contact with the insulating layer.

10. The integrated circuit of claim 8, wherein the insulating layer is disposed between the bottom source/drain layer and a substrate.

11. The integrated circuit of claim 8, wherein the at least one vertical transport field effect transistor further comprises:
    at least one liner surrounding the insulating layer.

12. The integrated circuit of claim 11, wherein the at least one liner is in contact with a bottom surface of the bottom source/drain layer.

13. The integrated circuit of claim 8, wherein the bottom source/drain layer is in contact with and surrounds a lower portion of the at least one semiconductor fin.

\* \* \* \* \*